United States Patent [19]
Northrup et al.

[11] Patent Number: 6,064,078
[45] Date of Patent: May 16, 2000

[54] FORMATION OF GROUP III-V NITRIDE FILMS ON SAPPHIRE SUBSTRATES WITH REDUCED DISLOCATION DENSITIES

[75] Inventors: John E. Northrup, Palo Alto; Linda T. Romano, Sunnyvale; Ross D. Bringans, Cupertino, all of Calif.

[73] Assignee: Xerox Corporation, Stamford, Conn.

[21] Appl. No.: 09/083,137

[22] Filed: May 22, 1998

[51] Int. Cl.⁷ .............................. H01L 33/00; H01L 21/20
[52] U.S. Cl. ....................... 257/96; 257/103; 257/190; 257/76; 438/47; 438/94; 438/95
[58] Field of Search ................................ 257/94, 96, 76, 257/103, 190; 438/46, 47, 94, 516, 518, 95

[56] References Cited

U.S. PATENT DOCUMENTS

| | | | |
|---|---|---|---|
| 5,306,386 | 4/1994 | De Lyon | 156/612 |
| 5,382,542 | 1/1995 | Zinck et al. | 438/46 |
| 5,399,206 | 3/1995 | De Lyon | 148/334 |
| 5,670,798 | 9/1997 | Schetzina | 257/96 |

OTHER PUBLICATIONS

Appl. Phys. Lett. 71(16), Oct. 20, 1997, "Structure of GaN films grown by hydride vapor phase epitaxy", L.T. Romano et al., pp. 2283–2285.

Submission to Journal of Crystal Growth, "The Growth of Gallium Nitride by Hydride Vapor Phase Epitaxy", R.J. Molnar; Massachusetts Institute of Technology, Lincoln Laboratory, Lexington, MA 02173–9108; W. Gotz et al., Xerox Palo Alto Research Center, Palo Alto, CA 94304, 12 pages, Jun. 1998.

Nature, International weekly journal of Science, vol. 386, Mar. 27, 1997, "Nitride–based semiconductors for blue and green light–emitting devices", F.A. Ponce et al., pp. 351–359.

*Primary Examiner*—Minh Loan Tran
*Attorney, Agent, or Firm*—Oliff & Berridge, PLC

[57] ABSTRACT

A single layer of atoms of a selected valence is deposited between a substrate and a group III–V nitride film to improve the quality of the nitride film and of subsequently deposited nitride films on the substrate. The interlayer provides local charge neutrality at the interface, thereby promoting two-dimensional growth of the nitride film and reduced dislocation densities. When the substrate is sapphire, the interlayer should include atoms of group II elements and possibly group III elements. The structure can include a group III–V nitride buffer layer on the interlayer to further enhance the quality of the group III–V nitride films. The structures can be used in blue light emitting optoelectronic devices.

40 Claims, 3 Drawing Sheets

FORMATION OF GROUP III–V NITRIDE FILMS ON SAPPHIRE SUBSTRATES WITH REDUCED DISLOCATION DENSITIES

BACKGROUND OF THE INVENTION

1. Field of Invention

This invention is directed to the field of semiconductors. More particularly, this invention is directed to group III–V nitride epitaxial semiconductor films for use in blue light emitting optoelectronic devices and also to a method of forming structures including the semiconductor films.

2. Description of Related Art

High-efficiency solid-state optoelectronic devices based on group III–V nitrides have a sufficiently wide bandgap for short-wavelength visible light emission. For example, the Al—Ga—In—N system has a bandgap which covers the entire visible spectrum. III–V nitrides have been used in short-wavelength light-emitting diode (LED) devices to provide bright green-to-ultraviolet light at high efficiencies. InGaN is used in green and blue LEDs. LEDs cover all three primary colors of the spectrum (red, green and blue) and accordingly can be used in various combinations to produce any color. III–V nitrides have also been used in diode lasers that operate at room temperature and emit visible light in the blue-violet range under continuous operation. These diode lasers emit coherent radiation and focus light into smaller spots, enabling higher-density optical data storage and higher-resolution printing. Blue semiconductor lasers are especially promising for such applications due to their reduced wavelength. These lasers can potentially be combined with green and red lasers to create projection displays and color film printers.

III–V nitrides provide the important advantage of having a strong chemical bond which makes them highly stable and resistant to degradation under high electric current and intense light illumination conditions that are present at the active regions of optoelectronic devices. These materials are also resistant to dislocation formation once grown.

Due to the high growth temperatures of III–V nitrides, there are presently only a limited number of known substrates suitable for supporting nitride film growth. The most commonly used substrate materials are sapphire and silicon carbide. These materials have significantly different lattice parameters and thermal expansion coefficients than the III–V nitrides. Consequently, the interfaces formed between the substrates and nitrides lack coherence, resulting in increased interface strain and interface energy, and diminished film wetting. These factors largely affect the nitride film growth process and the quality of the resulting nitride films. For example, the growth process of III–V nitrides on sapphire using known processes is highly three-dimensional. III–V nitride film growth occurs initially by the formation of discrete three-dimensional nitride islands on the substrate. These islands grow and coalesce with each other. Lattice matching is poor at the regions of the film at which the islands coalesce. High dislocation densities are generated at these regions. Dislocation arrays in the nitride film adversely affect the optoelectronic properties of devices fabricated on the nitride films by affecting carrier recombination processes in the active regions of the devices, and ultimately reducing emitted light intensities and device efficiencies.

SUMMARY OF THE INVENTION

Two-dimensional growth of III–V nitride films on substrates is desirable to reduce the dislocation densities in the films. In known processes, however, two-dimensional growth is inhibited by the high interface energy between the substrates and the films. Two-dimensional growth begins only after the islands coalesce and dislocations form. Forming buffer layers on sapphire substrates is known to enhance two-dimensional nucleation of GaN films on the buffer layers. Although this approach has yielded GaN films having improved electrical and luminescent properties, further increasing the degree of atomic ordering at the interfaces between the substrates and GaN films would increase the quality of the GaN films.

Thus, improved group III–V nitride films grown on substrates are desirable. Particularly, improved group III–V nitride films are desired that have reduced dislocation densities and improved electrical properties and can be used in optoelectronic devices to provide enhanced device performance.

This invention provides group III–V nitride films grown on substrates that have reduced dislocation densities.

This invention also provides a method of forming the improved group III–V nitride films on substrates.

The group III–V nitride films can be used in light emitting devices including LEDs and diode lasers to improve device performance.

A structure according to an aspect of this invention comprises a substrate; an interlayer on the substrate; and a group III–V nitride film on the interlayer. The interlayer provides approximate or even exact local charge neutrality at the interface between the substrate and the group III–V nitride films. This charge neutrality promotes two-dimensional growth of the group III–V nitride film, resulting in reduced dislocation densities and improved electrical and optical properties of the films.

The substrate typically comprises sapphire. The interlayer comprises atoms of at least one group II element. Group II elements have a valence of two. The interlayer comprises a sufficient number of atoms of the group II elements to achieve approximate or exact local charge neutrality at the interface between the substrate and the group III–V nitride film. This single layer of atoms has an areal density (atoms/area) that is less than or equal to that of one "monolayer", where a "monolayer" is defined herein as a layer one atom layer thick and having an areal density equivalent to the areal density of nitrogen atoms in a (0001) plane of unstrained bulk AlN. The interlayer atoms provide local charge neutrality by donating electrons to oxygen atoms in the sapphire substrate and to nitrogen atoms in the group III–V nitride at the interface region. In some instances, exact local charge neutrality can be achieved by replacing some of the group II element atoms with atoms of one or more group III elements. Group III elements have a valence of three and thus donate one additional electron to the oxygen atoms of the sapphire substrates, compared to the group II elements.

The group III–V nitride films can comprise, for example, binary compounds such as GaN and AlN, ternary alloys such as AlGaN and InGaN, and quaternary alloys.

A structure according to another aspect of this invention comprises a substrate; an interlayer on the substrate; a group III–V nitride buffer layer on the interlayer; and a group III–V nitride epitaxial film on the buffer layer. The group III–V nitride epitaxial films replicate the defect structure of the buffer layer. Accordingly, because the defect (dislocation) structure of the buffer layer is improved by the provision of the interlayer on the substrate, the defect structures of the epitaxial films grown on the buffer layer can be improved as well.

According to another aspect of this invention, the interlayer can be formed by depositing atoms of group II, and possibly group III, elements using different techniques. For example, the atoms can be deposited as individual atoms, as ions, or as oxides of group II, and possibly group III, elements.

The improved group III–V nitride films formed according to this invention can be used in optoelectronic devices to improve device performance.

BRIEF DESCRIPTION OF THE DRAWINGS

The preferred embodiments of this invention will be described in detail, with reference to the following figures, in which.

DETAILED DESCRIPTION OF PREFERRED EMBODIMENTS

This invention is directed to group III–V nitride films formed on substrates for optoelectronic device applications, and to a method of forming the group III–V nitride films on substrates.

Group III–V nitrides comprise elements selected from groups III and V of the periodic table. There are known group III–V nitride compounds and alloys comprising group III elements including Al, Ga and In and the group V element N. These materials are deposited on substrates to produce layered structures usable in optoelectronic devices, including LEDs and diode lasers. These devices emit visible light over a wide range of wavelengths.

The performance of the optoelectronic devices depends on the quality of the group III–V nitride films formed on the substrates. An important structural characteristic of the group III–V nitride films that affects their quality is dislocation density. This invention provides improved group III–V nitride films that have reduced dislocation densities. These films can be used in optoelectronic devices to provide enhanced device performance.

More particularly, this invention provides structures comprising improved group III–V nitride films on substrates. The structures are formed by depositing an interlayer on substrates and then depositing group III–V nitride films on the substrates. The interlayer improves the quality of the group III–V nitride films grown on the substrates.

According to an aspect of this invention, the interlayer comprises approximately one monolayer of atoms having a valence that provides an effective number of electrons at an interface formed between the substrates and group III–V nitride films to improve the quality of the films and of subsequently formed films on the substrate. A "monolayer" is defined herein as a layer one atom thick that has an areal density equivalent to the areal density of nitrogen atoms in a (0001) plane of unstrained bulk AlN. The interlayer donates electrons to achieve approximate or even exact local charge neutrality at the interface. This charge neutrality affects the interface energy, improving the wetting of the substrate by the group III–V nitride films. Improved wetting promotes two-dimensional growth of the group III–V nitride films on the substrates, resulting in group III–V nitride films having lower dislocation densities than three-dimensionally grown films formed according to known processes.

Figure 1:
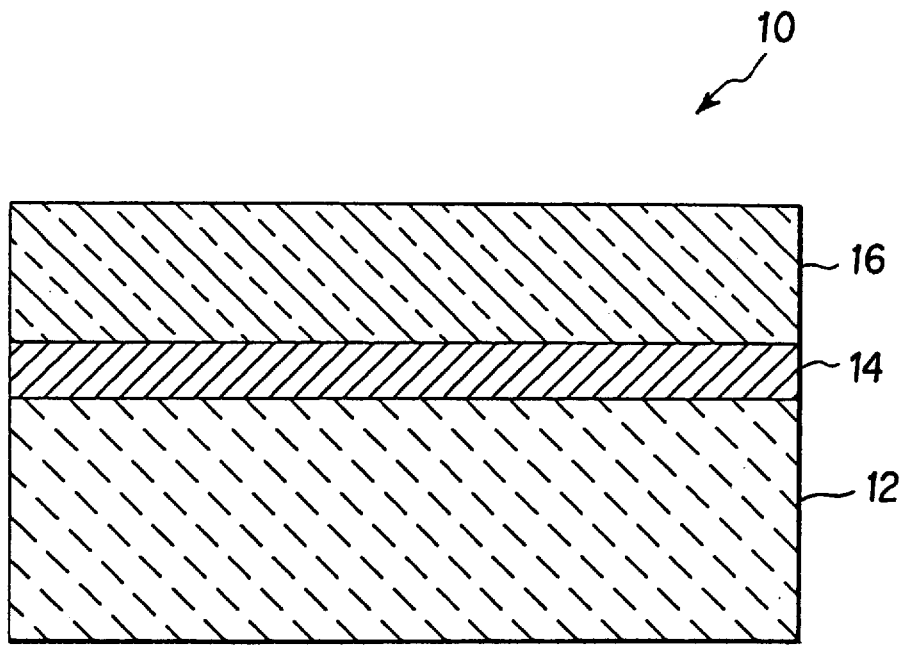
FIG. 1 is a cross-sectional view of a structure comprising a substrate, an interlayer on the substrate, and a group III–V nitride film on the interlayer, according to an embodiment of this invention.

FIG. 1 illustrates an embodiment of a layered structure 10 that can be formed according to an aspect of this invention. The structure comprises a substrate 12, an interlayer 14 formed on the substrate 12, and a group III–V nitride film 16 formed on the interlayer 14.

The substrate 12 is typically a sapphire substrate. Such sapphire substrates are referred to herein as the sapphire substrate 12. Suitable sapphire substrates include A-plane and c-plane oriented sapphire single crystals. The A-plane is the (11$\bar{2}$0) plane and the c-plane is the (0001) plane.

The interlayer 14 comprises atoms of at least one element selected from group II elements of the periodic table. The group II atoms have a valence of two. Suitable group II elements include, but are not limited to, Zn, Mg, Ca and Cd. As described in greater detail below, the group II elements have an electronic configuration that enables them to be used in the structure 10 to achieve local electronic matching and charge neutrality at the interface between the substrate and group III–V nitride films grown on the substrate.

The group II atoms in the interlayer 14 bond ironically both to oxygen atoms in the sapphire substrate 12 and to nitrogen atoms of the group III–V nitride film 16 on the interlayer 14. Each nitrogen atom in the group III–V nitride film 16 is tetrahedrally coordinated with three neighboring group III elements. Each nitrogen atom is also ironically bonded to one neighboring group II atom. The ionic bonding is non-directional. Consequently, the interface 14 formed between the sapphire substrate 12 and the group III–V nitride film 16 exerts minimal lateral strain on the sapphire substrate 12 and the group III–V nitride film 16. In addition, the interface energy is reduced and wetting of the sapphire substrate 12 by the group III–V nitride film 16 is enhanced. These effects decrease the dislocation density at the interface and in the epitaxial films grown on the interface, improving the performance of light emitting devices fabricated on the structures.

According to another aspect of this invention, the interlayer 14 can also include, in addition to atoms of group II elements, atoms of group III elements of the periodic table. The group III elements have a valence of three. Atoms of one or more group III elements can be included in the interlayer 14 in combination with atoms of one or more group II elements to provide exact charge neutrality at the interface between the substrate and the group III–V nitride film 16 formed on the interlayer 14. Suitable group III elements for the interlayer 14 include, but are not limited to, Al, Ga and In.

The group III–V nitride film 16 deposited on the interlayer 14 can comprise various group III–V nitride materials, depending on the specific types of optoelectronic devices fabricated on the structure. Suitable group III–V nitride materials include binary compounds such as GaN, ternary alloys such as AlGaN and InGaN, and quaternary alloys.

Figure 2:
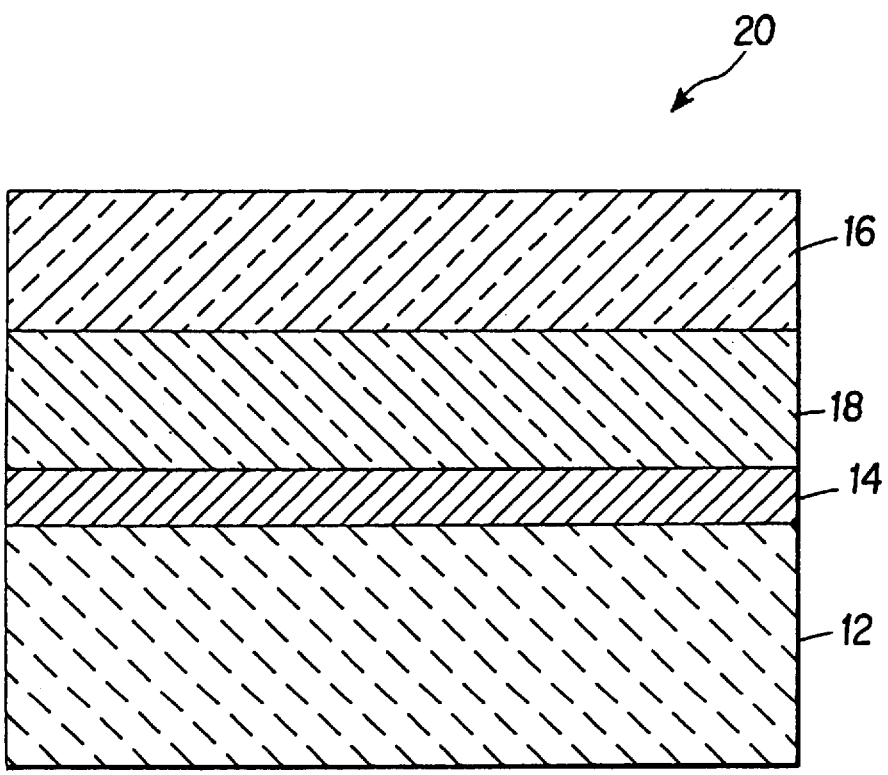
FIG. 2 is a cross-sectional view of a structure comprising a substrate, an interlayer on the substrate, and a buffer layer disposed between the interlayer and a group III–V nitride film, according to another embodiment of this invention.

FIG. 2 illustrates a structure 20 according to another aspect of this invention The structure 20 comprises a group III–V nitride buffer layer 18 grown on the interlayer 14 and a group III–V nitride film 16 grown on the buffer layer 18.

The buffer layer 18 functions as a substrate for subsequent epitaxial growth and promotes two-dimensional growth of the group III–V nitride film 16 on the buffer layer 18. The buffer layer 18 improves the quality of the group III–V nitride film 16 by reducing the dislocation density in the group III–V nitride film 16. Epitaxial group III–V nitride films grown on buffer layers replicate the defect structure of the surface of the buffer layer 18, resulting in dislocation densities no higher than in the buffer layer 18. Because the buffer layer 18 has a reduced dislocation density due to the interlayer 14 formed on the sapphire substrate 12, the epitaxial group III–V nitride film 16 also has a reduced dislocation density.

For example, the buffer layer 18 can be a low-temperature AlN or GaN buffer layer. The group III–V nitride film 16 can be an epitaxial group III–V compound nitride film, or a group III–V alloy nitride film grown on the buffer layer 18. For example, a GaN film or an AlGaN or InGaN film can be grown on AlN or GaN buffer layers 18 formed on the sapphire substrate 12.

The atoms in the interlayer 14 are preferably deposited as substantially a single layer of atoms on the sapphire substrate 12. According to an aspect of this invention, the interlayer 14 comprises a sufficient number of atoms to provide a sufficient number of electrons to the sapphire substrate 12 and to the group III–V nitride film 16 or the buffer layer 18 to achieve approximate or exact local charge neutrality (approximate or exact local charge neutrality means a local electronic charge of approximately, or exactly, zero, respectively) at the interface between the sapphire substrate 12 and the group III–V nitride layer 16, as in FIG. 1, or the buffer layer 18, as in FIG. 2. The number of atoms that provides charge neutrality is dependent on the planar area of the surface of the sapphire substrate 12 on which the interlayer 14 is formed, and the planar area of the surface of the group III–V nitride film 16 or the buffer layer 18 facing the interlayer 14.

Figure 3:
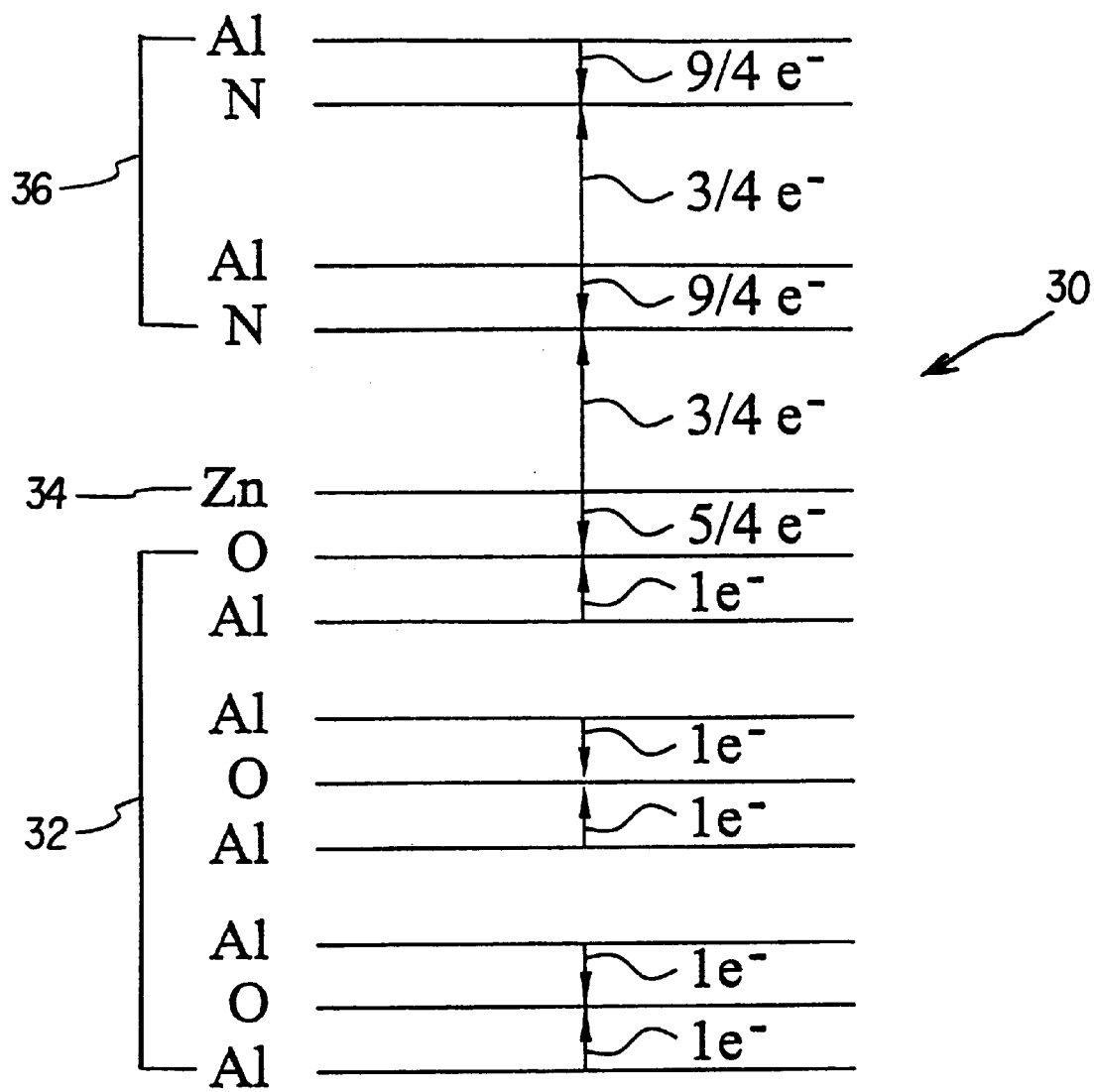
FIG. 3 illustrates an exemplary atomic arrangement at an $Al_2O_3$ (0001)-AlN (0001) interface of a structure according to an embodiment of this invention.

FIG. 3 schematically illustrates the atomic arrangement at the interface region 30 of an exemplary structure according to an embodiment of this invention. In this embodiment, the sapphire substrate is c-plane. The interface 30 includes a sapphire substrate portion 32, a zinc interlayer 34 on the sapphire substrate portion 32, and an AlN buffer layer portion 36 on the zinc interlayer 34. As shown, the structure of the sapphire substrate portion 32 may be described as including alternating layers of aluminum and oxygen atoms arranged in the sequence: —Al—Al—O—Al—Al—O—Al—Al. Each aluminum layer contains one-third as many atoms as each oxygen layer. The atoms in the oxygen layers have an approximately hexagonal arrangement and an atomic separation of about 2.75 angstroms. In bulk sapphire, each oxygen atom receives one electron from the aluminum layer below it and one electron from the aluminum layer above it, forming a neutral Al—O—Al "sandwich".

The AlN buffer layer portion 36 may be described as including alternating layers of Al and N atoms arranged in the sequence: —Al—N—Al—N—Al—N—Al—. Each layer contains equal numbers of aluminum and nitrogen atoms. AlN has a hexagonal crystal structure. The lattice constant for AlN is about 3.11 angstroms. The effective lattice mismatch between AlN and sapphire equals $(3.11-2.75)/2.75=13\%$. As shown, in bulk AlN, in each nitrogen layer, each nitrogen atom receives ¾ of an electron from the aluminum layer that has a greater separation distance, from that nitrogen layer, and ¼ of an electron from the aluminum layer that has the smallest separation distance from that nitrogen layer.

GaN can also be deposited on the sapphire substrate as the buffer layer 16. GaN has a hexagonal crystal structure and a lattice constant of about 3.18 angstroms. The effective lattice mismatch between GaN and sapphire equals $(3.18-2.75)/2.75=15.6\%$.

The interface 30 between the sapphire substrate portion 32 and the AlN buffer layer portion 36 with a zinc interlayer 34 may be described by the sequence of layers: Al—Al—O—Al—Al—O—Al—Al—O—Zn—N—Al—N—Al. Each oxygen atom at the interface 30 receives one electron from the aluminum atoms below the interface 30. Accordingly, each oxygen requires one additional electron from the zinc interlayer 34 to fill its p-shell. To satisfy the valence of the nitrogen atoms in the AlN buffer layer portion 36, each zinc atom in the interlayer 34 donates ¾ of an electron to each nitrogen atom to which it is bonded. The remaining 5/4 of an electron of each zinc atom is donated to oxygen atoms in the sapphire substrate portion 32. Thus, if the areal density of the zinc atoms in the zinc interlayer 34 is equal to ⅘ of the areal density of the oxygen atoms in the oxygen layer, then the zinc atoms contain an effective number of electrons to donate to the oxygen atoms to exactly satisfy the valence of the oxygen atoms. Stated equivalently, if the areal density of the oxygen atoms at the interface 30 is equal to 5/4 (1.25) of the areal density of the zinc atoms in the zinc interlayer 34, then the zinc atoms contribute an effective number of electrons to exactly satisfy the valence of the oxygen layer.

For completely unstrained materials, the interface 30 has a planar lattice constant of about 2.75 angstroms for sapphire and about 3.11 angstroms for AlN. Then, the relative density of oxygen to zinc is 1.28, which is very close to the ideal value of 1.25 that provides exact charge neutrality. Thus, the interlayer 14 according to this invention also enhances lattice matching at the interface, minimizing lateral strain in the substrate and in group III–V nitride films on the substrate.

As exemplified below, in some instances in which exact charge neutrality is not achieved at the interface 30 by the group II elements, exact local charge neutrality at the interface 30 is achieved by replacing a small number of the zinc atoms in the interlayer 34 with group III atoms, such as Al or Ga.

As a more explicit example, the interface 30 can be formed by mating an 8 atom×8 atom cell of a group III–V nitride with a 9 atom×9 atom cell of sapphire, and forming the interlayer 34 between the sapphire substrate and the group III–V nitride. The 81 oxygen atoms require 81 electrons for exact charge neutrality. The interlayer 34 can include, for example, 64 zinc atoms having a total of 80 electrons [64(5/4)] which can be donated to the 81 oxygen atoms of the sapphire. Thus, the deviation from exact charge neutrality is one electron per 81 oxygen atoms. This one electron deficit can be eliminated by substituting one zinc atom out of the 64 atoms in the interlayer 34 with one group III atom, such as Al or Ga. The group III atom has a valence of three and donates ¾ of an atom to the nitrogen atom to which it is bonded, and 2.25 electrons to the oxygen layer, thereby providing a total of 81 electrons for exact charge neutrality.

The interface 30 preferably has exact local charge neutrality to optimally reduce the dislocation densities in the group III–V nitride films. The number of atoms of the group II (and group III) elements in the interlayer can, however, provide less than or more than the number of electrons needed for exact charge neutrality at the interface and still provide improved epitaxial group III–V nitride films. Even if exact charge neutrality is not achieved in a given structure formed according to this invention, at least approximate charge neutrality is achieved. Approximate charge neutrality at the interface also provides improved group III–V nitride films having reduced dislocation densities due to enhanced wetting by the group III–V nitride films on the interlayer and to the reduced lateral strain at the interface.

Figure 4:
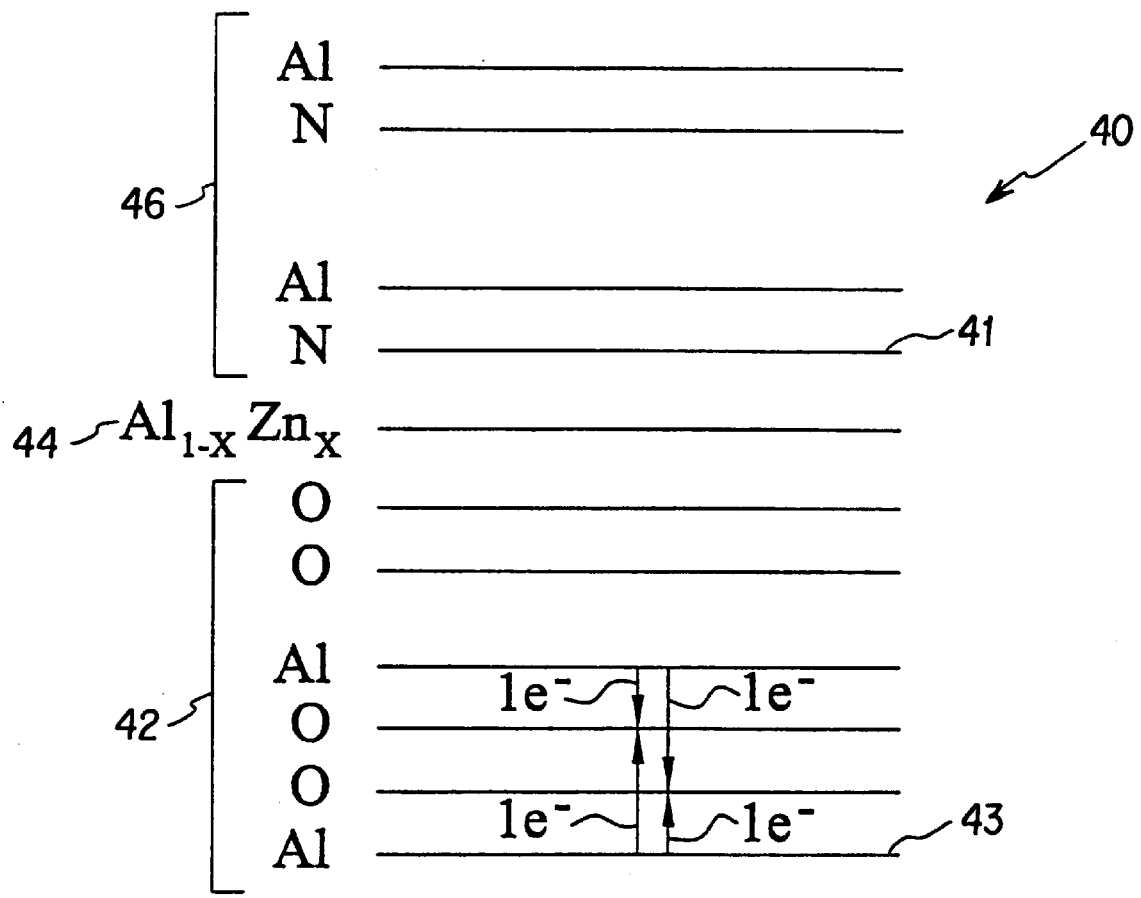
FIG. 4 illustrates an exemplary atomic arrangement at an $Al_2O_3$ (11$\bar{2}$0)-AlN (0001) interface of a structure according to an embodiment of this invention.

FIG. 4 schematically illustrates the atomic arrangement at the interface region 40 of a second exemplary structure according to an embodiment of this invention. In this embodiment, the sapphire substrate is the A-plane. The interface 40 includes a sapphire substrate portion 42, a zinc-containing interlayer 44 on the sapphire substrate portion 42, and an AlN buffer layer portion 46 on the zinc-containing interlayer 44. As shown, the structure of the sapphire substrate portion 42 may be described as including alternating layers of aluminum and oxygen atoms arranged in the sequence: Al—O—O—Al—O—O—Al. Each aluminum layer contains ⅔ as many atoms as each oxygen layer. In bulk sapphire, each oxygen atom receives one electron from the nearest aluminum layer that is below it and one electron from the nearest aluminum layer that is above it.

The AlN buffer layer portion 46 may be described as including alternating layers of Al and N atoms arranged in the sequence: —Al—N—Al—N—Al—N—Al—. Each layer contains equal numbers of aluminum and nitrogen atoms. AlN has a hexagonal crystal structure. The lattice constant for AlN is about 3.11 angstroms. As shown in FIG. 3, in bulk AlN, in each nitrogen layer, each nitrogen atom receives ¾ of an electron from the aluminum layer that has a greater separation distance, from that nitrogen layer, and 9/4 of an electron from the aluminum layer that has the smallest separation distance from that nitrogen layer.

GaN can also be deposited on the sapphire substrate as the buffer layer 16. GaN has a hexagonal crystal structure and a lattice constant of about 3.18 angstroms.

The interface 40 between the sapphire substrate portion 42 and the AlN buffer layer portion 46 with a zinc-containing interlayer 44 may be described by the sequence of layers: —Al—O—O—Al—O—O—(Al$_{1-x}$Zn$_x$)—N—Al—N—Al. The zinc-containing interlayer 44 contains a fraction, x, of zinc atoms and a fraction, 1–x, of aluminum atoms. This interlayer is denoted as (Al$_{1-x}$Zn$_x$). If x=1, the areal density of zinc atoms in the interlayer 44 is the same as the areal density of aluminum atoms in a (11$\bar{2}$0) plane 43 of bulk sapphire. To obtain charge neutrality at the interface between sapphire and AlN, the fraction x should be equal to about 0.70. The value of x is determined by use of electron-counting arguments similar to those employed for the c-plane sapphire substrate described above. The value of x that gives charge neutrality depends on the areal density of the N atoms in an (0001) plane 41 of the AlN buffer layer portion 46. To obtain charge neutrality the interface between sapphire and GaN, x should be equal to about 0.74. In the zinc-containing interlayer 44, it is possible to substitute another group II element such as Mg, Cd, or Ca for the Zn atoms. It is also possible to substitute another element from group III such as Ga or In for the Al atoms in the zinc-containing interlayer 44.

The exemplary structures 10 and 20 described above can be formed using conventional techniques known in the art. The interlayer 14 can be formed on the sapphire substrate 12 by any conventional deposition technique suitable for depositing atoms of group II and group III elements. For example, the interlayer can be formed by a conventional vapor phase deposition process known in the art, such as thermal evaporation, electron beam evaporation, or sputtering. As described in greater detail below, it is desirable to closely control the rate of deposition of the atoms of the interlayer 14 so that approximately an effective number of atoms of group II elements (and group III elements) can be deposited on the sapphire substrate 12 to achieve approximate or exact local charge neutrality at the interface.

The interlayer 14 can alternately be formed on the sapphire substrate 12 by depositing atoms of group II and group III elements as ions by a conventional ion implantation process known in the art, followed by annealing to diffuse the deposited elements into the interface region to form ionic bonds with atoms in the sapphire substrate 12 and the group III–V nitride film 16.

Optionally, the interlayer 14 can be formed by depositing the group II elements in the form of thin oxides of one or more group II elements on the sapphire substrate 12. Oxides of group II elements can be formed on the sapphire substrate 12 in combination with oxide(s) of one or more group III element(s) to include group II and group III atoms in the interlayer 14 for exact local charge neutrality at the interface. According to an aspect of this invention, the oxides of the group II (and possibly group III) elements formed on the sapphire substrate 12 are thin films and are preferably deposited as single layers.

The group III–V nitride film 16 can be epitaxially grown on the interlayer 14 or buffer layer 18 using a conventional vapor phase epitaxy process or a molecular beam epitaxy technique known in the art. For example, group III–V nitride films can be epitaxially grown on the sapphire substrate 12 or buffer layer 18 using a metallo-organic chemical vapor deposition (MOCVD) technique employing suitable precursor gases and process conditions.

The buffer layer 18 can be formed on the interlayer 14 using a conventional vapor phase epitaxy technique known in the art.

Providing the interlayer on the sapphire substrate improves the quality of group III–V nitride films grown on the substrate. Particularly, by contributing electrons to the sapphire substrate and the group III–V nitride films deposited on the interlayer, the resulting interface has approximate, or preferably, exact, charge neutrality. The charge neutrality at the interface promotes the two-dimensional growth of the group III–V nitride layer. In addition, the interlayer exerts only a small lateral force on the sapphire substrate and the group III–V nitride films. The interface is also stable. Consequently, the dislocation density at the interface and in epitaxial films grown on the interface is decreased, which improves the electrical and optical properties of devices formed on the substrates.

While this invention has been described in conjunction with the specific embodiments described above, it is evident that many alternatives, modifications and variations are apparent to those skilled in the art. Accordingly, the preferred embodiments of this invention as set forth above are intended to illustrative and not limiting. Various changes can be made without departing from the spirit and scope of this invention.

What is claimed is:

1. A semiconductor structure, comprising:
   a substrate;
   an interlayer formed on the substrate, the interlayer including a single atomic layer of atoms of at least one group II element; and
   a group III–V nitride film formed on the interlayer.

2. The semiconductor structure of claim 1, wherein the interlayer further includes atoms of at least one group III element.

3. The semiconductor structure of claim 1, wherein the interlayer includes about a monolayer of the atoms of the at least one group II element.

4. The semiconductor structure of claim 1, wherein the group III–V nitride film is GaN or AlN.

5. The semiconductor structure of claim 1, wherein the substrate is a sapphire substrate.

6. The semiconductor structure of claim 1, wherein the substrate is a sapphire substrate and the group III–V nitride film is AlN.

7. The semiconductor structure of claim 6, wherein the sapphire substrate is c-plane and the ratio of the number of oxygen atoms in each (0001) plane of the sapphire substrate to the number of group II atoms of the interlayer bonding with the oxygen atoms is about 1.25.

8. The semiconductor structure of claim 7, wherein the interlayer includes zinc.

9. The semiconductor structure of claim 6, wherein the sapphire substrate is A-plane and the fraction of group II atoms in the interlayer is about 0.70.

10. The semiconductor structure of claim 9, wherein the interlayer includes zinc.

11. The semiconductor structure of claim 6, wherein an interface between the substrate and the group III–V nitride film has at least approximate charge neutrality.

12. The semiconductor structure of claim 1, wherein the III–V nitride film is an epitaxial layer.

13. A semiconductor structure comprising:
 a substrate;
 an interlayer formed on the substrate, the interlayer including a single atomic layer of atoms of at least one group II element;
 a group III–V nitride buffer layer formed on the interlayer; and
 an epitaxial group III–V nitride film formed on the buffer layer.

14. The semiconductor structure of claim 13, wherein the interlayer includes about a monolayer of the atoms of the at least one group II element.

15. The semiconductor structure of claim 13, wherein the group III–V nitride buffer layer is AlN and the group II–V nitride film is GaN.

16. The semiconductor structure of claim 13, wherein the interlayer further includes atoms of at least one group III element.

17. The semiconductor structure of claim 16, wherein an interface formed between the substrate and the group III–V nitride buffer layer has exact charge neutrality.

18. The semiconductor structure of claim 13, wherein the substrate comprises sapphire and the group III–V nitride buffer layer is AlN.

19. The semiconductor structure of claim 18, wherein the sapphire substrate is c-plane and the ratio of oxygen atoms in each (0001) plane of the sapphire substrate to group II atoms in the interlayer is about 1.25.

20. The semiconductor structure of claim 19, wherein the interlayer includes zinc.

21. The semiconductor structure of claim 18, wherein the sapphire substrate is A-plane and the fraction of group II atoms in the interlayer is about 0.70.

22. The semiconductor structure of claim 21, wherein the interlayer includes zinc.

23. The semiconductor structure of claim 13, wherein an interface between the substrate and the group III–V nitride buffer layer has at least approximate charge neutrality.

24. The semiconductor structure of claim 13, wherein the substrate is a sapphire substrate.

25. The semiconductor structure of claim 13, wherein the interlayer comprises an effective number of atoms of the at least one group II element to achieve at least approximate charge neutrality at an interface between the substrate and the group III–V nitride buffer layer.

26. A method of forming a semiconductor structure, comprising:
 providing a substrate;
 forming an interlayer including a single atomic layer of atoms of at least one group II element on the substrate; and
 forming a group III–V nitride layer on the interlayer.

27. The method of claim 26, wherein an interface between the substrate and the group III–V nitride layer has at least approximate charge neutrality.

28. The method of claim 26, wherein the group III–V nitride layer is GaN.

29. The method of claim 26, wherein forming the group III–V nitride layer on the interlayer comprises:
 forming a group III–V buffer layer on the interlayer; and
 epitaxially depositing a group III–V nitride film on the buffer layer.

30. The method of claim 29, wherein the buffer layer is AlN and the group III–V nitride film is GaN.

31. The method of claim 26, wherein the interlayer comprises atoms of at least one group II element and atoms of at least one group III element, and an interface formed between the substrate and the group III–V nitride layer has exact charge neutrality.

32. The method of claim 26, wherein the substrate comprises sapphire and the group III–V nitride layer is AlN.

33. The method of claim 32, wherein the sapphire substrate is c-plane and forming the interlayer comprises depositing group II atoms on the sapphire substrate such that the ratio of the number of oxygen atoms in each (0001) plane of the sapphire substrate to the number of group II atoms of the interlayer bonding with the oxygen atoms is about 1.25.

34. The method of claim 33, wherein the interlayer includes zinc.

35. The method of claim 32, wherein the sapphire substrate is A-plane and the fraction of group II atoms in the interlayer is about 0.70.

36. The method of claim 35, wherein the interlayer includes zinc.

37. The method of claim 26, wherein forming the group III–V nitride layer comprises growing the group III–V nitride layer substantially two-dimensionally on the interlayer.

38. The method of claim 26, wherein forming the interlayer comprises ion implanting the atoms of the at least one group II element into the substrate.

39. The method of claim 26, wherein forming the interlayer comprises depositing a thin oxide layer of the least one group II element on the substrate.

40. The method of claim 26, wherein the substrate comprises sapphire.

* * * * *

UNITED STATES PATENT AND TRADEMARK OFFICE
CERTIFICATE OF CORRECTION

| | |
|---|---|
| PATENT NO. | : 6,064,078 |
| APPLICATION NO. | : 09/083137 |
| DATED | : May 16, 2000 |
| INVENTOR(S) | : John E. Northrup et al. |

It is certified that error appears in the above-identified patent and that said Letters Patent is hereby corrected as shown below:

Column 1, line 4, insert as a new paragraph:

This invention was made with Government support under Agreement No. MDA972-96-3-0014 awarded by ARPA. The Government has certain rights in this invention.

Signed and Sealed this

Third Day of October, 2006

JON W. DUDAS
*Director of the United States Patent and Trademark Office*